US011664366B2

(12) United States Patent
Tung (10) Patent No.: US 11,664,366 B2
(45) Date of Patent: May 30, 2023

(54) METHOD OF FORMING SEMICONDUCTOR DEVICE

(71) Applicant: UNITED MICROELECTRONICS CORP., Hsin-Chu (TW)

(72) Inventor: Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 130 days.

(21) Appl. No.: 17/481,300

(22) Filed: Sep. 21, 2021

(65) Prior Publication Data

US 2022/0005802 A1 Jan. 6, 2022

Related U.S. Application Data

(62) Division of application No. 16/721,940, filed on Dec. 20, 2019, now Pat. No. 11,158,623, which is a division of application No. 15/951,129, filed on Apr. 11, 2018, now Pat. No. 10,553,577.

(30) Foreign Application Priority Data

Feb. 13, 2018 (TW) .................................. 107105370

(51) Int. Cl.
*H01L 21/8238* (2006.01)
*H01L 27/02* (2006.01)
*H01L 29/66* (2006.01)
*H01L 29/78* (2006.01)
*H01L 27/092* (2006.01)

(52) U.S. Cl.
CPC .... *H01L 27/0207* (2013.01); *H01L 21/82385* (2013.01); *H01L 21/823821* (2013.01); *H01L 21/823842* (2013.01); *H01L 27/0924* (2013.01); *H01L 29/66795* (2013.01); *H01L 29/785* (2013.01); *H10B 10/12* (2023.02)

(58) Field of Classification Search
CPC .......... H01L 29/785; H01L 21/823842; H01L 27/0924; H01L 29/66795; H01L 27/1104; H01L 29/66545; H01L 29/1054; H01L 29/7847; H01L 27/0207; H01L 21/82385; H01L 21/823821; H01L 29/161; H10B 10/12
USPC .................................................. 257/401, 438
See application file for complete search history.

(56) References Cited

U.S. PATENT DOCUMENTS

| 8,675,397 | B2 | 3/2014 | Liaw |
| 9,455,202 | B2 | 9/2016 | Lee et al. |
| 9,786,647 | B1 * | 10/2017 | Huang ................ H01L 23/5226 |
| 10,192,968 | B2 * | 1/2019 | You ..................... H01L 27/0886 |
| 2005/0153490 | A1 | 7/2005 | Yoon |

(Continued)

FOREIGN PATENT DOCUMENTS

TW 201724280 A 7/2017

*Primary Examiner* — Hrayr A Sayadian
(74) *Attorney, Agent, or Firm* — Winston Hsu (57) ABSTRACT

A layout of a semiconductor device and a method of forming a semiconductor device, the semiconductor device include a first fin and a second fin disposed on a substrate, a gate and a spacer. The first fin and the second fin both include two opposite edges, and the gate completely covers the two opposite edges of the first fin and only covers one sidewall of the two opposite edges of the second fin. The spacer is disposed at two sides of the gate, and the spacer covers another sidewall of the two opposite edges of the second fin.

4 Claims, 5 Drawing Sheets

(56) References Cited

U.S. PATENT DOCUMENTS

| | | |
|---|---|---|
| 2015/0243667 A1 | 8/2015 | Liaw |
| 2016/0056161 A1 | 2/2016 | Hong et al. |
| 2016/0181395 A1 | 6/2016 | Liu |
| 2020/0119183 A1* | 4/2020 | Chang ............. H01L 21/823878 |

* cited by examiner

METHOD OF FORMING SEMICONDUCTOR DEVICE

CROSS REFERENCE TO RELATED APPLICATIONS

This application is a Divisional of application Ser. No. 16/721,940 filed Dec. 20, 2019 which is a Divisional of application Ser. No. 15/951,129 filed Apr. 11, 2018, and included herein by reference.

BACKGROUND OF THE INVENTION

1. Field of the Invention

The invention relates to a layout of semiconductor device, a semiconductor device and a method of forming the same, and more particularly, to a semiconductor device having a stress layer, and a layout and a forming method thereof.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof, so that, non-planar FETs, such as the fin field effect transistor (finFET) having a three-dimensional structure have replaced the planar FETs and become the mainstream of the development. Since the three-dimensional structure of a finFET increases the overlapping area between the gate and the fin shaped structure of the silicon substrate, the channel region can therefore be more effectively controlled. This way, the drain-induced barrier lowering (DIBL) effect and the short channel effect (SCE) are reduced.

The current formation of the finFET includes forming a fin shaped structure on a substrate primary, and then forming a gate on the fin shaped structure. The fin shaped structure generally includes the stripe-shaped fin formed by etching the substrate. However, with the demands of miniaturization of semiconductor devices, the width of each fin-shaped structure narrows and the spacing between the fin shaped structures shrinks. Thus, forming fin shaped structures which can achieve the required demands under the restrictions of miniaturization, physical limitations and various processing parameters becomes an extreme challenge.

SUMMARY OF THE INVENTION

It is one of the primary objectives of the present invention to provide a layout of a semiconductor device, in which two gates are provided to cross two fins respectively, with one gate thereof only across one side of the two opposite edges of one fin. Through this arrangement, another gate within the layout may therefore gain an enlarged process window, so that, the semiconductor device can obtain a better, more integrated layout.

It is one of the primary objectives of the present invention to provide a semiconductor device, in which a gate simultaneously crosses two adjacent fins, with the gate completely covering the two opposite edges of one fin thereof, and covering only a sidewall of the two opposite edges of another fin thereof, so as to gain an enlarged process window to another gate disposed adjacent the gate. In this way, the semiconductor device may achieve a better performance due to the better element arrangement.

It is one of the primary objectives of the present invention to provide a method of forming a semiconductor device, in which a gate is formed to simultaneously cross two adjacent fins, with both of the two opposite edges of one fin being completely covered by the gate, and with only one of the two opposite edges of another fin being covered by the gate. Thus, another gate formed adjacent to the gate may therefore gain an enlarged process window, so as to facilitate the entire forming process.

To achieve the purpose described above, the present invention provides a layout of a semiconductor device, including a first fin and a second fin, and a first gate and a second gate. The first fin and the second fin are parallel disposed along a first direction, and the first fin and the second fin both include two opposite edges in the first direction. The first gate extends along a second direction which is perpendicular to the first direction, across the first fin. The second gate extends along the second direction, adjacent to the first gate. The second gate is across the second fin to cover only one edge of the two opposite edges of the second fin, and to expose another edge of the two opposite edges of the second fin from the second gate.

To achieve the purpose described above, the present invention provides a semiconductor device. The semiconductor device includes a first fin and a second fin, a gate and a spacer. The first fin and the second fin are disposed on a substrate, and the first fin and the second fin both include two opposite edges. The gate is disposed on the substrate, to cover the first fin and the second fin. The gate completely covers both of the two opposite edges of the first fin and covers only one edge of the two opposite edges of the second fin. The spacer is disposed at two sides of the gate, to cover another edge of the two opposite edges of the second fin.

To achieve the purpose described above, the present invention provides a method of forming a semiconductor device, including the following steps. First of all, a first fin and a second fin are formed on a substrate, and the first fin and the second fin both include two opposite edges. Then, a dummy gate is formed on the substrate, to cover the first fin and the second fin. The dummy gate completely covers both of the two opposite edges of the first fin and covers only one edge of the two opposite edges of the second fin. Next, a spacer is formed at two sides of the dummy gate, with the spacer covering another edge of the two opposite edges of the second fin. Finally, a replacement process is performed to replace the dummy gate with a metal gate.

According to above, the forming method of the present invention is provided to form a gate which crosses two adjacent fins at the same time. It is noted that, the gate completely covers the two opposite edges of one fin thereof and only partially covers the two opposite edges of another fin thereof, for example only covering one edge of the two opposite edges, or covering the one edge and the top surface, so as to gain an enlarged space between the gate and another gate adjacent thereto. Thus, the forming method may therefore obtain a greater process window to the formation of the another gate, so as to prevent the formations of two gates getting interfered with each other. The forming method and the semiconductor device obtained therefrom are capable to be used in a practical semiconductor process, for example forming a semiconductor memory device like a static random access memory (SRAM) device. In this way, the present invention may be used to form an access transistor and a pull-up transistor adjacent to each other within the SRAM device, so that, the formation of the gate of the access transistor may gain an enlarged process window due to the shrunk gate of the pull-up transistor, for achieving a better device structure and a simplify process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 3 are schematic diagrams illustrating a method of forming a semiconductor device according to a first embodiment of the present invention, wherein:

DETAILED DESCRIPTION

To provide a better understanding of the present invention, preferred embodiments will be described in detail. The preferred embodiments of the present invention are illustrated in the accompanying drawings with numbered elements.

Figure 1:
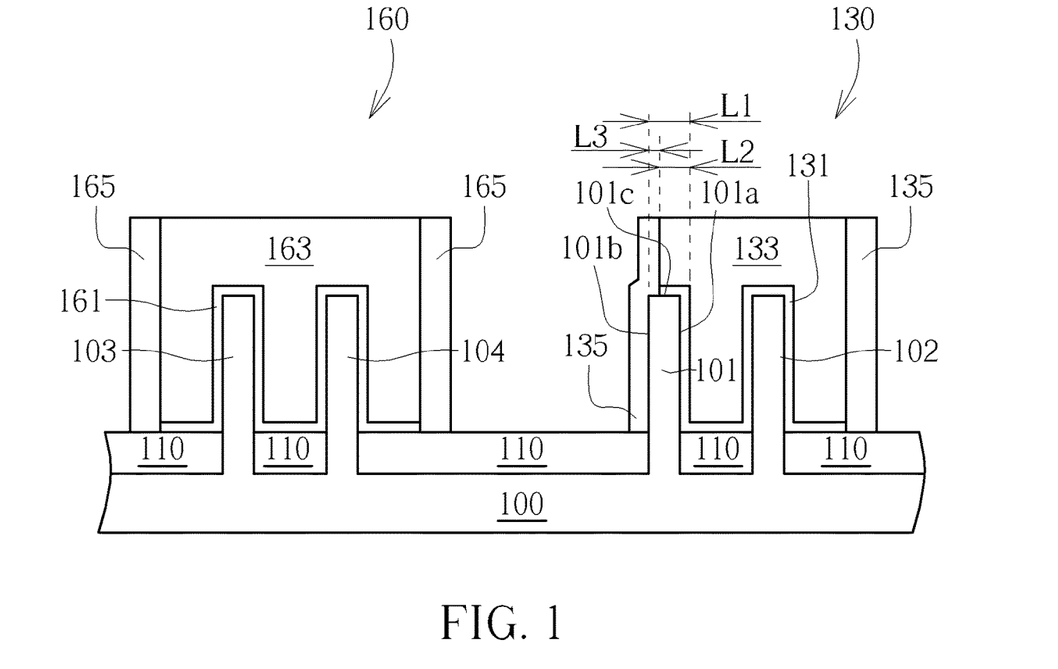
FIG. 1 shows a cross-sectional view of a semiconductor device after forming a dummy gate.
Figure 2:
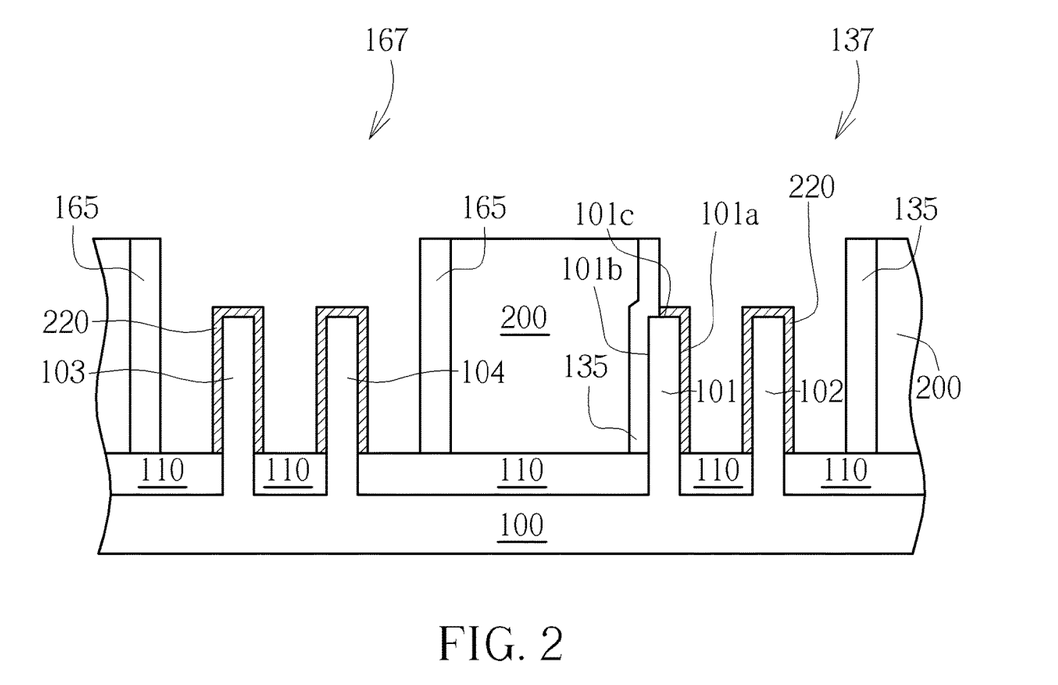
FIG. 2 shows a cross-sectional view of a semiconductor device after forming a capping layer.
Figure 3:
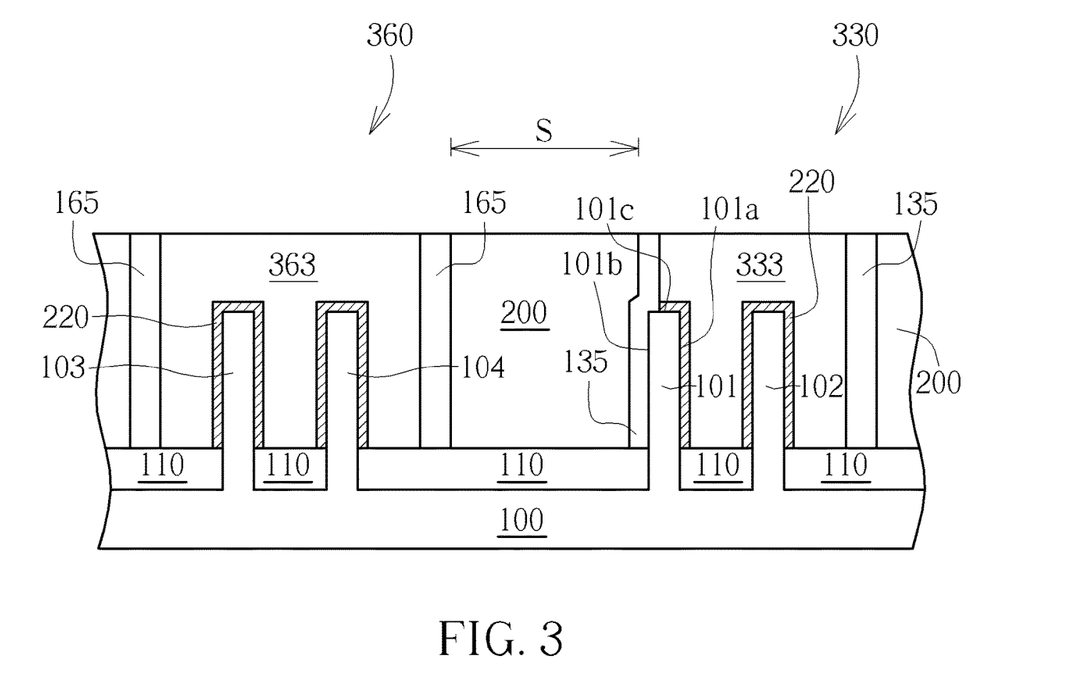
FIG. 3 shows a cross-sectional view of a semiconductor device after forming a metal gate.

Please refer to FIG. 1 to FIG. 3, which are schematic diagrams illustrating a method of forming a semiconductor device according to the first embodiment of the present invention. First of all, as shown in FIG. 1, a substrate 100 is provided, such as a silicon substrate, a silicon-containing substrate or a silicon-on-insulator (SOI) substrate, and at least one fin is formed in the substrate 100. For example, the present embodiment is exemplified by forming four fins 101, 102, 102, 104 in a silicon substrate 100. The formation of the fins 101, 102, 103, 104 is accomplished through a sidewall image transfer (SIT) technique, which includes performing a photolithography and etching process to form a plurality of patterned sacrificial layers (not shown in the drawings), performing a deposition and etching process to form a spacer (not shown in the drawings) at sidewalls of each of the patterned sacrificial layers, and then, removing the patterned sacrificial layers, followed by performing an etching process through the spacer, to form a plurality of shallow trenches (not shown in the drawings) in the substrate 100, and to define a plurality of fin shaped structures (not shown in the drawings) at the same time. Then, a deposition process and an etching back process are sequentially performed, to form an insulating layer 110 in the shallow trenches, so as to serve as a shallow trench isolation (STI). Through this performance, the insulating layer 110 covers the bottom portions of the fin shaped structures, and the upper portions may therefore protrude from the insulating layer 110, to form the fins 101, 102, 103, 104, as shown in FIG. 1.

Additionally, the forming method of the fin shaped structures in the present invention is not limited thereto, and in another embodiment of the present invention, the formation of the fin shaped structures may also be accomplished by first forming a patterned hard mask (not shown in the drawings) on the substrate 100, and then performing an epitaxial process on the exposed substrate 100 through the patterned hard mask to form a semiconductor layer (not shown in the drawings), such as silicon or silicon germanium layer, thereby being used as the corresponding fin shaped structures. Otherwise, in the embodiment of having the SOI substrate, the spacer maybe used to etch a semiconductor layer (not shown in the drawings) of the substrate 100 and stop at a bottom oxide layer underneath, to form the corresponding fin shaped structures.

Next, gate structures 130, 160 are formed to cross the fins 101, 102, 103, 104, with the gate structure 130 covering the fins 101, 102 and the gate structure 160 covering the fins 103, 104, respectively. The gate structures 130, 160 preferably include a dummy gate of polysilicon, so that, the formation thereof may be integrated with a general gate forming process. For example, a dielectric material (not shown in the drawings) for example including a dielectric material like silicon oxide, and a gate material layer (not shown in the drawings) for example including polysilicon are sequentially formed on the substrate 100, to cover the entire fins 101, 102, 103, 104, and then the gate material layer and the dielectric material layer are patterned, to form two stacked structure (not shown in the drawings) covering the fins 101, 102 at the right side and covering the fins 103, 104 at the left side respectively. After that, spacers 135, 165 are formed to surround the two stacked structure respectively, and the gate structures 130, 160 are obtained thereby.

It is noted that, while patterning the gate material layer and the dielectric material layer, the stacked structure at the right side of the substrate 100 are intentional formed to completely cover the fin 102, and to only partially cover the fin 101, such as only covering an edge 101a and a portion of a top surface 101c of the fin, as shown in FIG. 1. Accordingly, the spacer 135 formed subsequently may therefore disposed at two sides of the stacked structure, with the spacer 135 at the left side directly in contact with an exposed portion of the fin 101 from the stacked structure. For example, the spacer 135 at the left side right covers the rest portion of the top surface 101c and another edge 101b (being opposite to the edge 101a), so as to perform as a ladder-shape, as shown in FIG. 1. In the present embodiment, the conditions of the aforementioned patterning process are preferably controlled to make the stacked structure covering about ½ of a length of the fin 101, and more preferably, to make a length L1 of the covered portion of the top surface 101c being greater than a length L2 of the exposed portion, as shown FIG. 1. On the other hand, the stacked structure at the left side of the substrate 100 completely covers the fins 103, 104, as well as the substrate at two sides of the fins 103, 104, so that, the spacer 165 disposed at two sides of the stacked structure may directly disposed on the substrate 100, without contacting any portion of the fins 103, 104.

Then, source/drain regions (not shown in the drawings) are formed in the fins 101, 102, 103, 104, at two sides of the gate structures 130, 160, and a replacement metal gate process (RMG) process is performed to replace the gates 133, 136 and the gate dielectric layers 131, 161 with a high dielectric constant (high-k) dielectric layer (not shown in the drawings), a work function metal layer (not shown in the drawings) for example including a metal material like Ta/TaN or Ti/TiN, and a metal layer (not shown in the drawings) for example a low-resistant metal like copper (Cu) or tungsten (W), to form metal gate structures 330, 360. Precisely, after forming the source/drain regions, at least one stress memorization technique (SMT) may be optionally performed, to form an epitaxial structure for example via a selective epitaxial growth (SEG) process, for providing a suitable stress to the fins 101, 102, 103, 104, or to form a contact etching stop layer (CESL, not shown in the drawings), followed by forming an interlayer dielectric (ILD) layer 200 is formed to fill in the space at two sides of the gate structures 130, 160. Then, the gates 133, 163 and the gate dielectric layers 131, 161 are completely removed, to from two gate trenches 137, 167, for exposing the fins 101, 102, 103, 104 covered by the gate structures 130, 160, as shown in FIG. 2.

Following these, a capping layer 220 is formed, to cover on the exposed fins 101, 102, 103, 104 from the gate trenches 137, 167. In one embodiment, the capping layer for example includes germanium (Ge) or silicon germanium (SiGe), and the formation thereof may be accomplished through a SEG process, to form the capping layer 220 only disposed on surfaces of the fins 101, 102, 103, 104, as shown in FIG. 2. Then, a heat treatment may be optionally performed after forming the capping layer 220, so that, the stress material (for example the Ge having a greater grain size than Si) within the capping layer 220 may therefore diffuse into the fins 101, 102, 103, 104 gradually, but is not limited thereto. In another embodiment, the capping layer (not shown in the drawings) may also include a dielectric material like silicon nitride, and the formation thereof may be accomplished through a deposition process, to conformally forming the capping layer on the fins 101, 102, 103, 104 and the insulating layer 110 within the gate trenches 137, 167. After that, a heat treatment may also be optionally performed, with the stress provided by the capping layer to interact the original gain growth of the fins 101, 102, 103, 104, so as to lead to the required strain reaction. Then, the capping layer 220 is completely removed.

It is noteworthy that, since the edge 101*b* of the fin 101 is still covered by the spacer 135, the fin 101 is only partially covered by the capping layer 220. That is, regardless of the material the capping layer 220, the capping layer 220 may only covers the edge 101*a* and the portion of the top surface 101*c*, as shown in FIG. 2. Thus, while using the aforementioned heat treatment to induce the strain reaction, only a half of the fin 101 or slightly greater than a half of the fin 101 may include the corresponding diffused Ge or the interacted grain growth, and another half of the fin 101 or another portion of the fin covered by the spacer 135 remains original fin status.

Subsequently, the aforementioned high-k dielectric layer, the work function metal layer and the metal layer are sequentially formed in the gate trenches 137, 167, respectively, with the high-k dielectric layer and the work function metal layer being conformally formed in the gate trenches 137, 167, on the capping layer 220, and with the metal layer filled the gate trenches 137, 137. That is, the metal gates 333, 363 as shown in FIG. 3 are formed thereby.

Through the above steps, the forming method of a semiconductor device according to the first embodiment of the present invention is completed. According to the present embodiment, the conditions of the patterning process are intentionally controlled, so as to form the gate structure 130 to completely cross the fin 102 and to only partially cross the fin 101 (for example only covering the edge 101*a* and only a portion of the top surface 101*c*) adjacent to the fin 102. In this way, a space S within a particular length may be saved between the gate structure 130 and the gate structure 160 adjacent thereto, and which is preferably greater than the critical dimension (CD) of the patterning process. Then, the gate structures 160 may therefore obtain an enlarged process window, so as to facilitate the forming process thereof.

Figure 4:
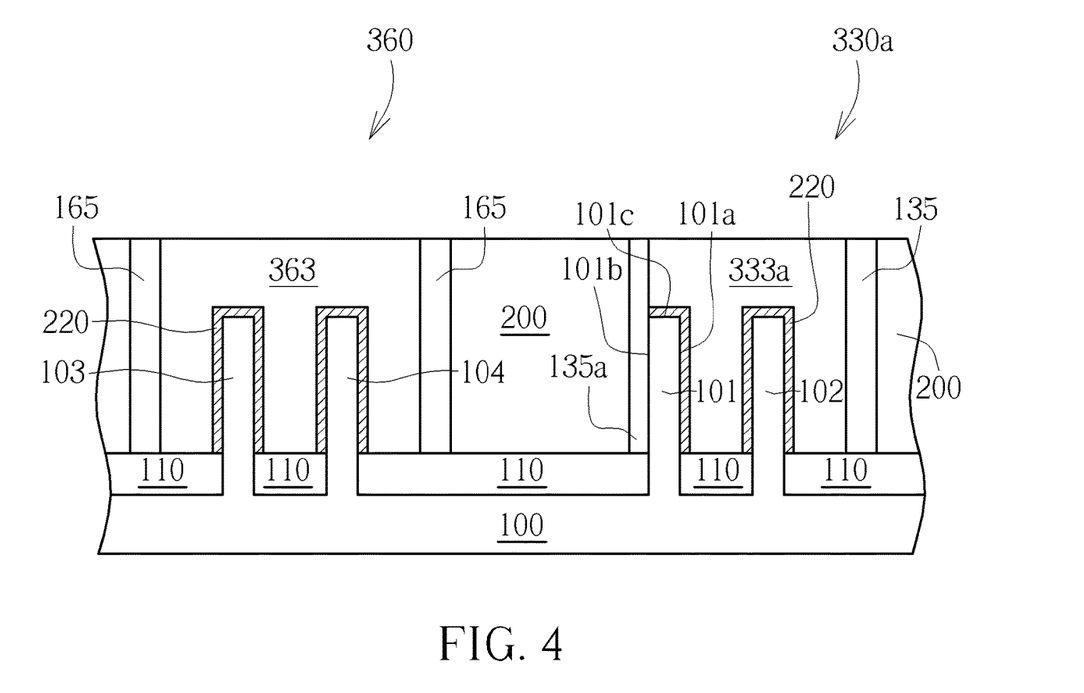
FIG. 4 is a schematic diagram illustrating a method of forming a semiconductor device according to another embodiment of the present invention.
Figure 5:
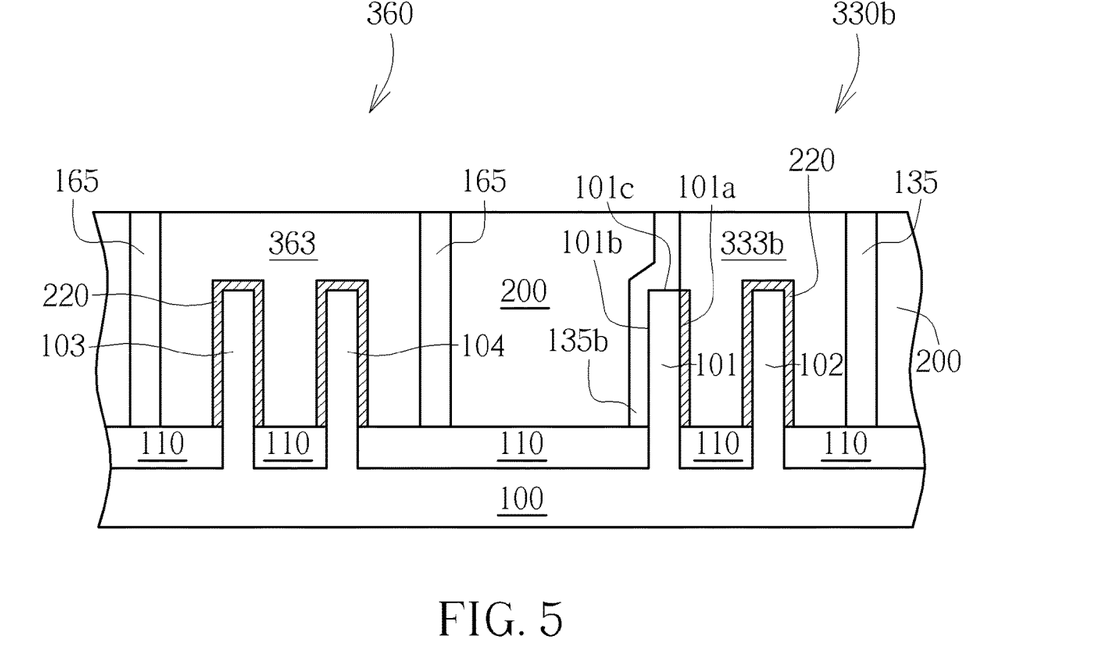
FIG. 5 is a schematic diagram illustrating a method of forming a semiconductor device according to the other embodiment of the present invention.

However, it has been fully understood by the people well skilled in the art, the semiconductor device of the present invention may also be formed through other methods rather than limited to the aforesaid manufacturing steps. For example, the conditions of the patterning process may be controlled to make the stacked structure at the right side of the substrate 100 further covers the entire edge 101*a* and the top surface 101*c* of the fin 101, so that, the spacer 135*a* disposed on two sides of the stacked structure may therefore be formed on the opposite edge 101*b*, to perform like a stripe-shape, as shown in FIG. 4. Then, the formations of the ILD layer 200 and the capping layer 220, and the RMG process are still performed in the subsequent processes, to form a metal gate 333*a* simultaneously covering the edge 101*a* and the top surface 101*c*, and to configure a metal gate structure 330*a* as shown in FIG. 4. In this way, the contacting area between the metal gate 333*a* and the fin 101 are sufficiently increased, and the metal gate structure 330*a* may therefore achieve a better performance. Otherwise, the conditions of the patterning process may be controlled to make the stacked structure at the right side of the substrate 100 covers only the edge 101*a* of the fin 101, so that, the spacer 135*b* disposed on two sides of the stacked structure may therefore be formed on the top surface 101*c* and the opposite edge 101*b* of the fin 101, to perform like an obvious ladder-shape, as shown in FIG. 5. Then, the formations of the ILD layer 200 and the capping layer 220, and the RMG process are still performed in the subsequent processes, to form a metal gate 333*b* only covering the edge 101*a*, and to configure a metal gate structure 330*b* as shown in FIG. 5. In this way, while the fin is configured to serve as a dummy fin, the layout of metal gate 330*b* may be further shrunk due to the aforementioned arrangement, so as to further gain an enlarged process window to the gate structure 360 adjacent to the metal gate structure 330*b*.

Moreover, although the formations of the strain fins of the aforementioned embodiments are all exemplified by additionally forming a capping layer (for example including Ge, SiGe or SiN) on the fins 101, 102, 103, 104 during the RMG process, to make the fins 101, 102, 103, 104 obtaining the stress reaction thereby, to serve as strain fins, the forming of the strain fins in the present invention are not limited thereto, and may further include other forming processes. For example, before forming the fin shaped structure, a portion of the substrate 100 may be previously replaced by a stress layer (for example including Ge or SiGe, not shown in the drawings). That is, while forming the fin shaped structure through the aforementioned processes, the substrate 100 and the stress layer may be simultaneously etched, to obtain the fin shaped structures with each of them having a portion of the stress layer, to serve as strain fins.

Figure 6:
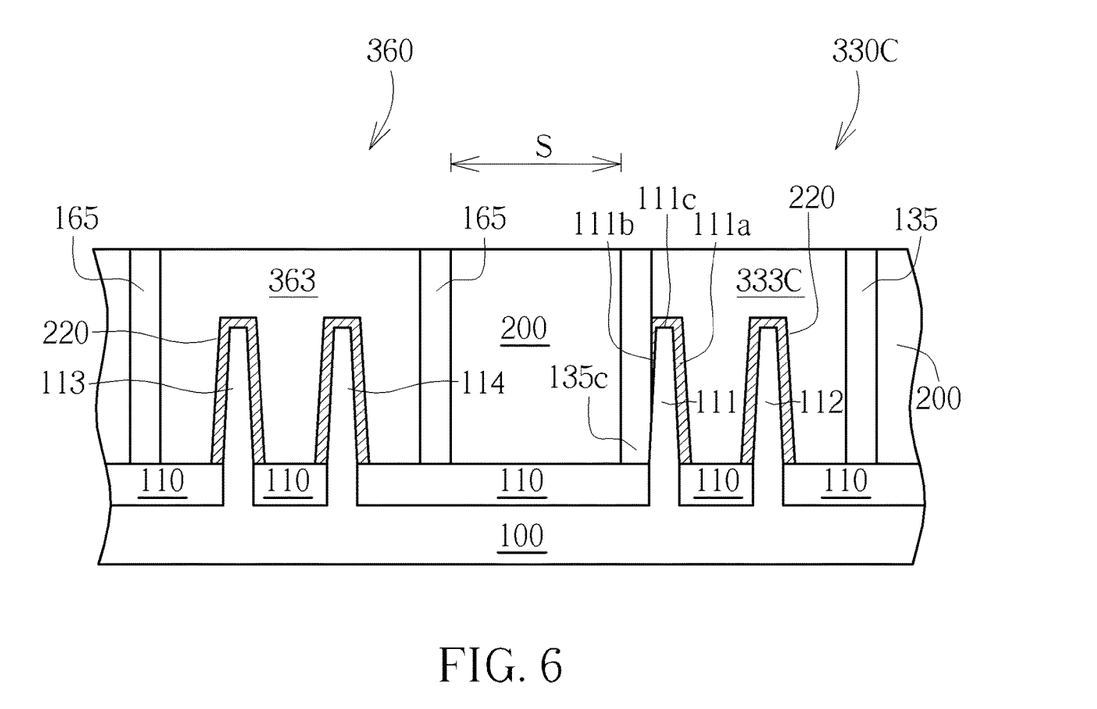
FIG. 6 is a schematic diagram illustrating a method of forming a semiconductor device according to the other embodiment of the present invention.

Also, although the fins 101, 102, 103, 104 of the aforementioned embodiments are all exemplified to have a uniform dimension from a cross-sectional view as shown in FIGS. 1-5, the practical fins of the present invention are not limited thereto, and the features thereof may be adjusted according to product requirements. For example, in one embodiment, fins 111, 112, 113, 114 may include a continuous increased dimension as shown in FIG. 6., with the dimension of each fin 111, 112, 113, 114 being continuous increased from top to bottom. Accordingly, while controlling the conditions of the patterning process to make the stacked structure at the right side of the substrate 100 further covers an edge 111a, an top surface 111c and a portion of another edge 111b of the fin, the spacer 135c disposed on two sides of the stacked structure may therefore be formed only on the rest portion of the another edge 111b, as shown in FIG. 6. Then, the subsequent formed capping layer 220 may not directly contact the rest portion of the another edge 111b. Following these, the RMG process is still performed to form a metal gate 333c simultaneously covering the edge 111a, the top surface 111c, and the portion of the anther edge 111b, to configure a metal gate structure 330c as shown in FIG. 6. In this way, the contacting area between the metal gate 333c and the fin 111 are further enlarged for achieving a better performance.

Overall speaking, the forming method of the present invention is provided to form a gate which crosses two adjacent fins at the same time. It is noted that, the gate completely covers the two opposite edges of one fin thereof and only partially covers the two opposite edges of another fin thereof, for example only covering one edge of the two opposite edges, or covering the one edge and the top surface, so as to gain an enlarged space between the gate and another gate adjacent thereto. Thus, the forming method may therefore obtain a greater process window to the formation of the another gate, so as to prevent the formations of two gates getting interfered with each other. The forming method and the semiconductor device obtained therefrom are capable to be used in a practical semiconductor process, for example forming a semiconductor memory device like a static random access memory (SRAM) device, to provide a better structure and a more integrate layout.

Figure 7:
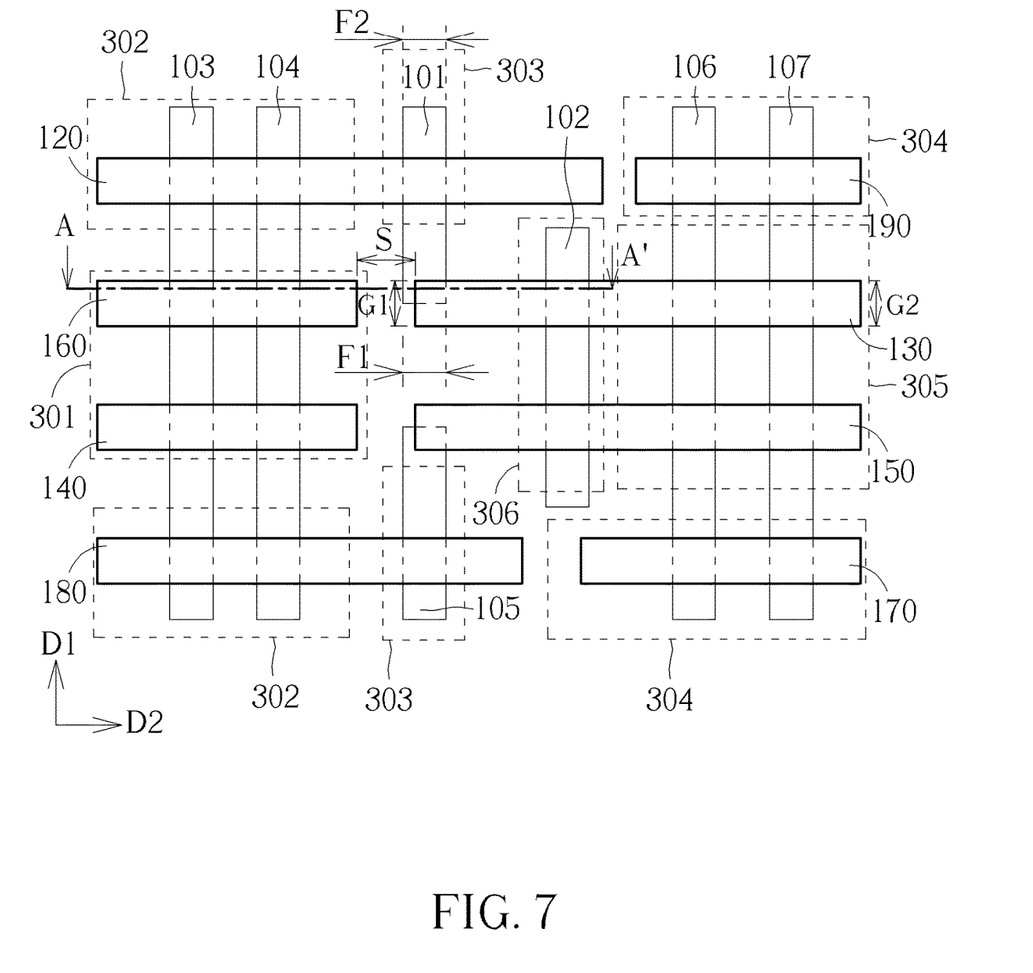
FIG. 7 is a schematic diagram illustrating a layout of a semiconductor device according to a preferably embodiment of the present invention.

As shown in FIG. 7, a SARM device for example includes a plurality of fins 101, 102, 103, 104, 105, 106, 107 disposed on a substrate (not shown in the drawings), and each of the fins 101, 102, 103, 104, 105, 106, 107 are parallel extended along a direction D1 (such as a y-direction), to perform like plural stripe-shape structures within the same or different lengths. Also, a plurality of gate structures 120, 130, 140, 150, 160, 170, 180, 190 are further disposed on the substrate, and which are parallel extended along another direction D2 (such as a x-direction) which is perpendicular to the direction D1. In the present embodiment, the gate structures 120, 160, 140, 180 are sequentially arranged along the direction D1, in alignment with the gate structures 190, 130, 150, 170 respectively. That is, each gate structures 120, 130, 140, 150, 160, 170, 180, 190 are across each fins 101, 102, 103, 104, 105, 106, 107, to define six transistor regions 301, 302, 303, 304, 305, 306.

Precisely, the transistor region 301 is formed by making the two adjacent gate structures 140, 160 in the direction D1 simultaneously across the middle portions of two fins 103, 104; the transistor region 302 is formed by making the two gate structures 120, 180 respectively across the two sides of the fins 103, 104; the transistor region 303 is formed by making the gate structures 120, 180 respectively across the fins 101, 105; the transistor region 304 is formed by making the gate structures 190, 170 respectively across the two sides of the fins 106, 107; the transistor region 305 is formed by making the gate structures 130, 150 simultaneously across the fins 106, 107; and the transistor region 306 is formed by making the gate structures 130, 150 simultaneously across the fin 102. The transistor regions 303, 306 both include a p-type metal oxide semiconductor (PMOS) transistor, and which are functioned as a pull-up (PU) transistor region. The transistor regions 302, 305 both include a n-type metal oxide semiconductor (NMOS) transistor, and which are functioned like a pull-down (PD) transistor region. The transistor regions 301, 304 both include a NMOS transistor, and which are functioned like an access transistor (PG) transistor region. Thus, the two PU transistor regions 303, 306, the two PD transistor regions 302, 305 and the two PG transistor regions 301, 304 together form a six-transistors cell of the SRAM device (6T-SRAM). Also, the two PG transistors are controlled by a word line (WL, not shown in the drawings) that determines whether the current SRAM cell is selected or not. The storage portion of the SRAM cell is formed of four transistors, two PU transistor regions 303, 306 and two PD transistor regions 302, 305, in true and complementary form, which make a cross-coupled latch-like pair of CMOS inverters. The PU transistor region 306 and the PD transistor region 305 form one inverter, and the PU transistor region 303 and the PD transistor region 302 form another inverter.

It is noted that, the aforementioned forming method is used in the SRAM device, to make the layouts of the gate structure 160 within the transistor region 301 and the gate structure 130 within the transistor region 306 being arranged like what is shown in FIG. 1. In other words, FIG. 1 namely shows a cross-sectional view of a semiconductor structure taken along a cross line A-A' in FIG. 7, and the gate structure 130 of the PU transistor region 306 has been shrunk back to gain an enlarged process window to the gate structure 160 of the transistor region 301. Precisely speaking, each of fins 101, 102, 103, 104, 105, 106, 107 includes two opposite ends F1, F2 (namely a shorter sidewall of each fin) along the direction D2, with a length L1 as shown in FIG. 1, and further includes two opposite edges (namely a longer sidewall of each fin) along the direction D1, with a length (not shown in the drawings) greater than the length L1 of the two opposite ends. Also, each of the gate structures 120, 130, 140, 150, 160, 170, 180 includes two opposite ends G1, G2 (namely a shorter sidewall of each gate structure) along the direction D1, and further includes two opposite edges (namely a longer sidewall of each gate structure), with a greater length than that of the two opposite ends G1, G2. In the present embodiment, the gate structure 130 of the PU transistor region 306 is formed to completely cross the two opposite edges of the fin 102, and to only partially cross the fin 101, for example crossing only one edge of the two opposite edges, and only one end of the two opposite ends, as shown in FIG. 7.

In other words, one end G1 of the gate structure 130 and one end F1 of the fin 101 are partially overlapped with each other. Preferably, the overlapped portion between the gate structure 130 and the fin 101 has a length being about ½ of the length of the end G1 (½ G1), or greater than ½ G1, and the length of the overlapped portion is greater than ½ of the length L1 of the end F1 (½ L1), more preferably to about ¾ L1, but is not limited thereto. That is, the end F1 of the fin 101 is able to expose from the gate structure 130, to result in the shrinking back of the gate structure 130. Then, the space S between the gate structure 130 and the gate structures 160 adjacent thereto is allowable to be maintained at a particular length, preferably being greater than the CD (for example the spacer between the gate structures 120, 190), so as to gain an enlarged process window to the gate structure 160, and to facilitate the forming process of the SRAM device thereby.

On the other hand, another gate structure 150 of the PU transistor region 306 may also be shrunk back to perform like similar features and structures of the aforementioned gate structure 130. In this arrangement, the possible merge between two adjacent gate structures (such as the gate structures 160, 130) in the same extending direction due to limited process window, may be sufficient avoided. Following these, the formations of the ILD and the RMG process may be continuously performed according to the aforementioned embodiments. Also, during performing the RMG process, the capping layer 220 as shown in FIG. 2 may still be formed on the fins 101, 102, 103, 104, 105, 106, 107, to transfer those fins 101, 102, 103, 104, 105, 106, 107 into strain fins.

According to above, the preferably layout of the semiconductor device in the present invention is completed. In the present embodiment, the aforementioned forming method is practical used on the layout of a SRAM device, through shrinking back the gate structure 130 of the PU transistor region 306 to gain an enlarged process window to the gate structure 160 of the PG transistor region 301. Furthermore, since the fin 101 may serve as a dummy fin in the PU transistor region 306, the shrunk gate structure 130 will not cause any defects to the general functions of the PU transistor region 306. Thus, the aforementioned layout not only can save a particular space S between the gate structure 130 of the PU transistor region 306 and the gate structure 160 of the PG transistor 301, for gaining an enlarged process window, but also can maintain a better elemental performance to entire device.

Figure 8:
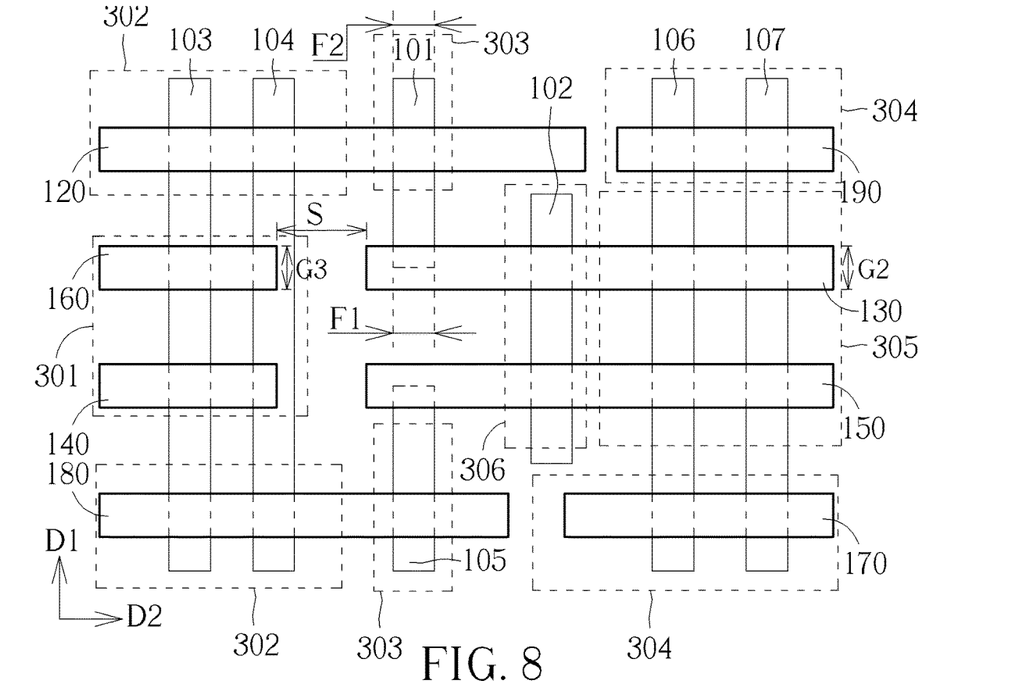
FIG. 8 is a schematic diagram illustrating a layout of a semiconductor device according to another preferably embodiment of the present invention.
Figure 9:
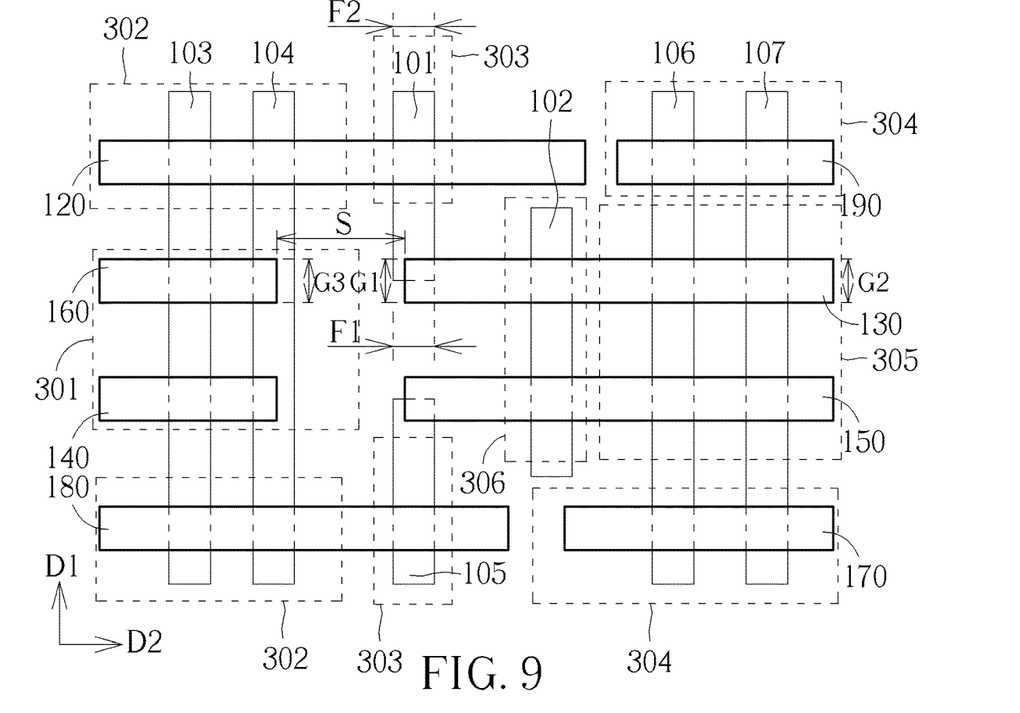
FIG. 9 is a schematic diagram illustrating a layout of a semiconductor device according to the other preferably embodiment of the present invention.

Those skilled in the art should easily understand that the layout of the semiconductor device in the present invention may also include variant embodiments. For example, in another embodiment, the gate structure 160 of the PG transistor region 301 may be optionally shrunk back, such as making the gate structure 160 completely crossing the two opposite edges of the fin 103 and only partially crossing the two opposite edges of the fin 104. That is, one end G3 of the gate structure 160 is completely disposed within the area of the fin 104, as shown in FIG. 8, so as to gain an enlarged process window to the gate structure 130 of the PU transistor region 306. Otherwise, in another embodiment, the gate structure 130 of the PU transistor region 306 and the gate structure 160 of the PG transistor region 301 are both shrunk back, as shown in FIG. 9, to further save a greater space S between the two gate structures 130, 160. Therefore, the formations of the two gate structures 130, 160 may both obtain an enlarge process window, to facilitate the entire process of the SRAM device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming semiconductor device, comprising:
    forming a first fin and a second fin on a substrate, the first fin and the second fin both comprising two opposite edges;
    forming a dummy gate on the substrate, to cover the first fin and the second fin, wherein the dummy gate completely covers both of the two opposite edges of the first fin and covers only one edge of the two opposite edges of the second fin;
    forming a spacer at two sides of the dummy gate, the spacer covering another edge of the two opposite edges of the second fin; and
    performing a replacement process, to replace the dummy gate with a metal gate.

2. The method of forming semiconductor device according to claim 1,
    wherein the replacement process comprises:
    removing the dummy gate to form a gate trench; and
    filling a metal layer in the gate trench to form the metal gate.

3. The method of forming semiconductor device according to claim 2, further comprising:
    after removing the dummy gate, forming a capping layer in the gate trench to cover the first fin and the second fin.

4. The method of forming semiconductor device according to claim 3, wherein the capping layer completely covers both of the two opposite edges of the first fin and covers only one edge of the two opposite edges of the second fin.

* * * * *